United States Patent
Furuyashiki et al.

(10) Patent No.: US 8,274,125 B2
(45) Date of Patent: Sep. 25, 2012

(54) SEMICONDUCTOR DEVICE AND SEMICONDUCTOR DEVICE MANUFACTURING METHOD

(75) Inventors: Junya Furuyashiki, Kagoshima (JP); Noriyuki Yoshikawa, Osaka (JP); Toshiyuki Fukuda, Kyoto (JP); Toshimasa Itooka, Kagoshima (JP); Hiroki Utatsu, Kagoshima (JP)

(73) Assignee: Panasonic Corporation, Osaka (JP)

( * ) Notice: Subject to any disclaimer, the term of this patent is extended or adjusted under 35 U.S.C. 154(b) by 253 days.

(21) Appl. No.: 12/918,023

(22) PCT Filed: Feb. 26, 2009

(86) PCT No.: PCT/JP2009/000862
§ 371 (c)(1),
(2), (4) Date: Aug. 17, 2010

(87) PCT Pub. No.: WO2009/113262
PCT Pub. Date: Sep. 17, 2009

(65) Prior Publication Data
US 2011/0001208 A1    Jan. 6, 2011

(30) Foreign Application Priority Data
Mar. 11, 2008   (JP) .................................. 2008-060668

(51) Int. Cl.
*H01L 27/146* (2006.01)
(52) U.S. Cl. ................................ 257/433; 257/E23.119
(58) Field of Classification Search .......... 257/433–436, 257/680, E23.119, 98–100
See application file for complete search history.

(56) References Cited

U.S. PATENT DOCUMENTS

| 6,143,588 | A  | * | 11/2000 | Glenn ............................ 438/116 |
| 7,122,874 | B2 | * | 10/2006 | Kim ............................... 257/433 |
| 7,166,908 | B2 | * | 1/2007 | Minamio et al. .............. 257/680 |
| 7,187,067 | B2 | * | 3/2007 | Weng et al. ................... 257/680 |
| 7,227,236 | B1 | * | 6/2007 | Lee et al. ....................... 257/433 |
| 7,365,421 | B2 | * | 4/2008 | Webster et al. ................ 257/704 |
| 7,531,848 | B2 | * | 5/2009 | Shin .............................. 257/100 |
| 7,547,962 | B2 | * | 6/2009 | Weng et al. ................... 257/680 |
| 7,719,097 | B2 | * | 5/2010 | Watanabe ...................... 257/680 |
| 7,745,897 | B2 | * | 6/2010 | Tan et al. ....................... 257/433 |
| 2003/0170933 | A1 | | 9/2003 | Manansala |
| 2004/0055155 | A1 | | 3/2004 | Manansala |
| 2007/0176274 | A1 | | 8/2007 | Yoneda et al. |
| 2008/0311707 | A1 | | 12/2008 | Yoneda et al. |

FOREIGN PATENT DOCUMENTS

| JP | 2002-076154 | 3/2002 |
| JP | 2002-222821 | 8/2002 |
| JP | 2004-006689 | 1/2004 |
| JP | 2006-186288 | 7/2006 |
| JP | 2007-150038 | 6/2007 |
| JP | 2007-189182 | 7/2007 |
| JP | 2009-081346 | 4/2009 |

* cited by examiner

*Primary Examiner* — Nathan Ha
(74) *Attorney, Agent, or Firm* — McDermott Will & Emery LLP

(57) ABSTRACT

An insulation is provided in a portion surrounding a light receiving portion in a semiconductor element, and a sealing resin is provided around the insulation, thereby warping the insulation outward when viewed from the light receiving portion to prevent diffuse light from returning to the light receiving portion of the semiconductor element.

7 Claims, 17 Drawing Sheets

(a)

(b)

(a)

(b)

SEMICONDUCTOR DEVICE AND SEMICONDUCTOR DEVICE MANUFACTURING METHOD

RELATED APPLICATIONS

This application is the U.S. National Phase under 35 U.S.C. §371 of International Application No. PCT/JP2009/000862, filed on Feb. 26, 2009, which in turn claims the benefit of Japanese Application No. 2008-060668, filed on Mar. 11, 2008, the disclosures of which Applications are incorporated by reference herein.

TECHNICAL FIELD

The present invention relates to semiconductor devices and manufacturing methods of the semiconductor devices, and more particularly to semiconductor devices in which semiconductor elements including light receiving portions mounted on substrates, and manufacturing methods of the semiconductor devices.

BACKGROUND ART

Semiconductor light receiving devices include photosensor chips on substrates provided with electrodes, and transparent protective layers covering the chips. This is to protect parts such as electrode pads, wires, and light receiving portions from corrosion due to moisture contained in the air, and dust.

However, in recent years, with miniaturization of electronic devices, components including semiconductor light receiving devices have been often miniaturized and incorporated into electronic devices to form integrated components. Such integrated components are often encapsulated with resin and thus, exterior portions typically provide no gaps which allow moisture and dust to seep into the devices.

With respect to hard disk drives, the drives themselves are hermetically encapsulated, and the inside is filled with clean air including an extremely small amount of moisture and dust.

In such hermetically encapsulated semiconductor light receiving devices, there is no need to cover light receiving portions with transparent protection layers as described above, but the light receiving portions may be exposed. The semiconductor light receiving devices with the exposed light receiving portions are advantageous in improving light receiving sensitivity. Note that semiconductor chips with exposed light receiving portions are called bare chips.

In a manufacturing method of a semiconductor light receiving device shown in Patent Document 1, a resist is deposited on a light receiving portion by photolithography, the resin is molded, and then the resist is removed to obtain a bare chip.

PATENT DOCUMENT 1: Japanese Patent Publication No. 2007-150038

SUMMARY OF THE INVENTION

Technical Problem

In a semiconductor light receiving device without transparent protective layer on a light receiving portion, a terminal or the like for connecting a substrate to a photosensor chip is molded with sealing resin, and only the light receiving portion is exposed. That is, the light receiving portion is formed on the bottom of a recess made of a resin body.

In such a semiconductor light receiving device, if light reflected by a wall surface of the recess made of the resin body is incident on the light receiving portion, a light receiving element reflects the incident light, and the light reflected by the surface of the light receiving element strikes the wall surface of the sealing resin to cause diffuse reflection. This diffuse light is received by the light receiving element again to make an output of the light receiving element unstable.

Solution to the Problem

In order to solve the above-described problems, a semiconductor device according to the present invention includes a semiconductor element, and a substrate on which the semiconductor element is mounted. The semiconductor element includes a light receiving portion and a bonding pad on a first surface. A back surface of the first surface is mounted on the substrate. An extraction electrode is formed on a mounting surface of the substrate on which the semiconductor element is mounted. The bonding pad and the extraction electrode are connected together by a metal thin wire. A first insulation, which exists between the light receiving portion and the bonding pad and surrounds the light receiving portion, is provided on the first surface of the semiconductor element. The bonding pad and the metal thin wire are encapsulated with a sealing resin. An outer edge of the first insulation is in contact with the sealing resin on the first surface of the semiconductor element. An inner wall of the first insulation facing the light receiving portion and surrounding the light receiving portion has a tapered shape, in which an opening area expands with an increase in a distance from the first surface of the semiconductor element.

Advantages of the Invention

In the semiconductor device of the present invention, an insulating frame body is formed around a light receiving portion, and a sealing resin is formed around the frame body. Thus, when curing the sealing resin, the frame body is pulled outward to incline the wall surface of the frame body. Therefore, the present invention reduces malfunction of the semiconductor device, even if undesired light reflected by the light receiving portion is diffusely reflected by the wall surface.

DESCRIPTION OF REFERENCE CHARACTERS

1 Semiconductor Device
3 Substrate
5 Substrate Surface
7 First Surface
10 Semiconductor Element
12 Light Receiving Portion
14 Bonding Pad
16 Bonding Pad
18 Extraction Electrode
20 Bonding Wire (Metal Thin Wire)
22 Mounting Surface
24 Sealing Resin
26, 27 Through Electrodes
28, 29 Back Surface Electrodes
30 First Insulation
31 Second Insulation
34 Wall Surface
39 Opening
43 Trough Hole
61 Third Insulation

DESCRIPTION OF EMBODIMENTS

Figure 17:
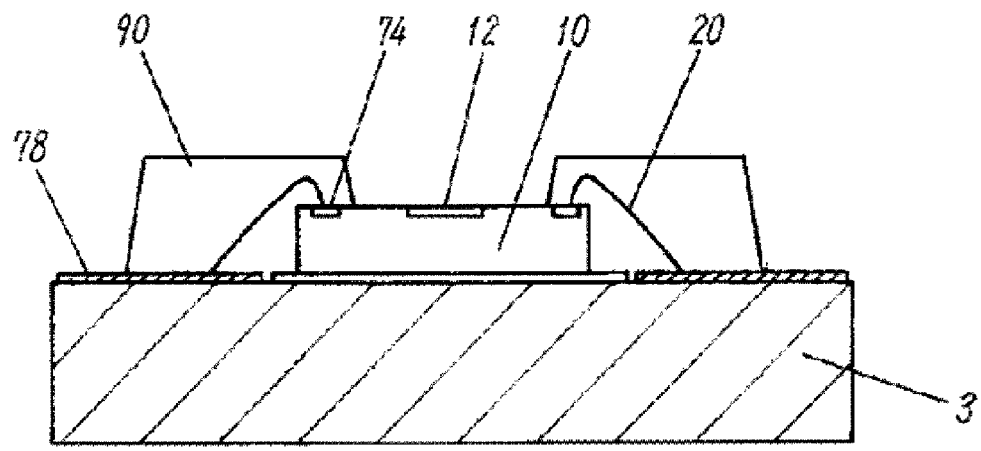
FIG. 17 illustrates a semiconductor device including a bare chip according to a related technique.

A semiconductor light receiving device, which includes a bare chip shown in FIG. 17 mounted on a substrate, is considered as a related technique to the present invention. In this semiconductor light receiving device, a bare chip 10 is mounted on a substrate 3, an electrode pad 74 in the bare chip is connected to an extraction electrode 78 on the substrate by wire bonding with a bonding wire 20. Except for a light receiving portion 12; the electrode pad 74, the bonding wire 20, and an electrode connecting portion are molded with the resin 90. In order to form such a structure, the light receiving portion 12 needs to be protected in advance by something (e.g., a resist) before being molded with the resin 90.

Figure 18:
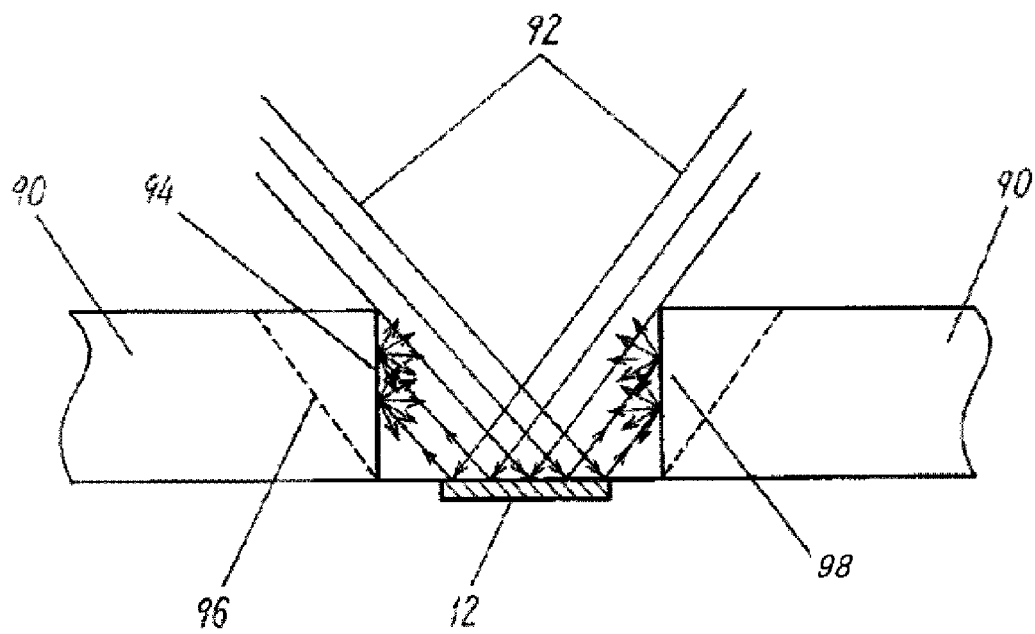
FIG. 18 is an enlarged view of the bare chip in FIG. 17 near the element.

FIG. 18 is a cross-sectional view of proximity of the light receiving portion 12. The light receiving portion 12 is provided on a bottom of a recess surrounded by the resin 90. When incident light 92 enters from the periphery, the light is reflected by the light receiving portion 12 and a wall surface 94 of the resin 90 to cause diffuse reflection 98.

If light is incident on such a semiconductor light receiving device, the light reflected by the surface of the light receiving element strikes the wall surface of the resin to cause diffuse reflection. This diffuse light is received again at the light receiving element to make an output of the light receiving element unstable.

Specifically, this problem may occur when semiconductor light receiving devices are arranged in series. Light for an adjacent light receiving device is incident from an oblique direction, totally reflected by the light receiving portion, and strikes the wall surface of the resin to be diffusely reflected. This causes erroneous detection as if another light is received at the light receiving portion.

The wall surface of this resin has an area of about hundreds μm. Once the resin is formed, it is not easily processed mechanically. Also, if photolithography is used for inclining the wall surface 94 like a wall surface 96 to avoid the above-described diffuse reflection, the process becomes complex to increase costs.

After various researches to solve these problems, the present inventors arrived at the present invention. Embodiments will be described hereinafter with reference to the drawings.

First Embodiment

Figure 1:
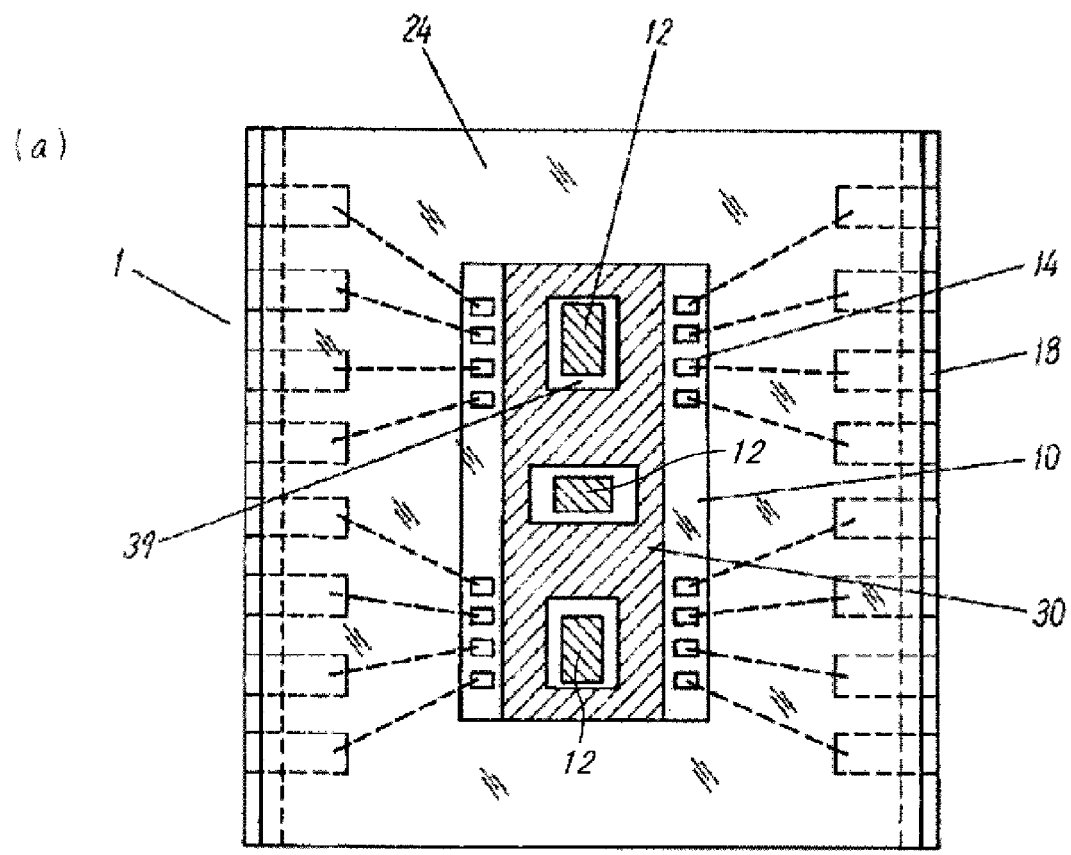
FIG. 1(a) is a schematic top view illustrating the structure of a semiconductor device according to an embodiment.
FIG. 1(b) is a schematic sectional view.
Figure 1:
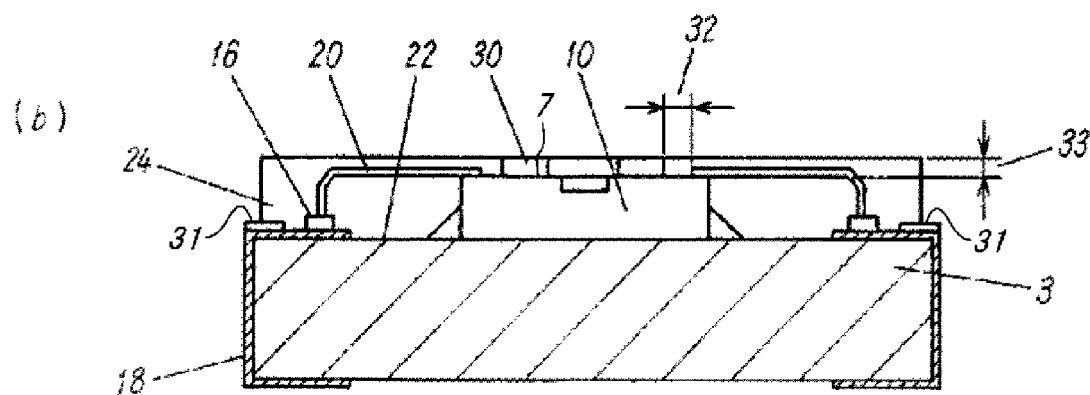

FIG. 1 illustrates a structure of a semiconductor device 1 of a first embodiment. FIG. 1(a) is a plan view, and FIG. 1(b) is a cross-sectional view. In the semiconductor device 1, a semiconductor element 10 is mounted on a mounting surface 22 of the substrate 3 provided with extraction electrodes 18. The semiconductor element 10 includes light receiving portions 12 and bonding pads 14 for wire bonding formed on one surface (a first surface) 7 of a semiconductor substrate made of, e.g., silicon. In FIG. 1(a), the light receiving portions 12 and the first insulation 30, which are not cross-sectional views, are hatched for simplicity of illustration.

A plurality of light receiving portions 12 may be formed in a single semiconductor element 10. FIG. 1 shows an example where three light receiving portions 12 are formed in a single semiconductor element 10. With respect to the positional relationship between the light receiving portions 12 and bonding pads 14 in the semiconductor element 10, the bonding pads 14 are located in an outer periphery of the first surface 7 of the semiconductor element 10. The light receiving portions 12 are located in the central portion of the first surface 7 as compared to the bonding pads 14. In this embodiment, four bonding pads 14 are formed at each of right, left, top, and bottom corners.

The material for the substrate 3 is not limited but is preferably epoxy such as glass epoxy, phenol, Teflon (registered trademark), polyethylene, and the like. A plurality of extraction electrodes 18 are formed on the mounting surface 22 of the substrate 3. Substrate side bonding pads 16 are formed as part of the extraction electrodes 18. The substrate side bonding pads 16 are wire bonded to the bonding pads 14 on the semiconductor element 10. Note that the substrate side bonding pads 16 may be omitted, and the bonding pads 14 may be directly wire bonded to the extraction electrodes 18.

The extraction electrodes 18 may be formed not only on the substrate 3 but on a side surface of the substrate 3, and may be formed on the back surface of the substrate 3 via through holes. FIG. 1 illustrates an example where the extraction electrodes 18 are formed to the back surface through a side surface of the substrate 3.

The substrate 3 and the semiconductor element 10 are connected together by bonding wires (metal thin wires) 20 on the respective bonding pads 16 and 14. In this embodiment, the bonding pads 14 on the semiconductor element 10 are located higher than the mounting surface 22 which is a surface of the substrate 3. The bonding pads 14 are not formed on the side surface of the semiconductor element 10. In this embodiment, the bonding wires 20 once rise from the bonding pads 16 on the substrate, and then are connected to the bonding pads 14 on the semiconductor element. This is because the bonding wire is formed by reverse wire bonding described below.

The bonding wires 20 and the part of the semiconductor element 10 on the substrate 3 except for the light receiving portions 12 are encapsulated with a sealing resin 24. The bonding pads 14 on the semiconductor element 10 are also encapsulated with the sealing resin 24. This is for protection of the bonded portion between the substrate 3 and the semiconductor element 10, and the bonding wires 20. However, the light receiving portions 12 of the semiconductor element 10 are not covered with the sealing resin 24. This is because receiving sensitivity can be improved without the sealing resin 24.

In the semiconductor device 1 of this embodiment, the first insulation 30 is formed on the semiconductor element 10 to surround the light receiving portions 12 to protect the semiconductor element 10 from damages due to static electricity and to function as a boundary between the light receiving portions 12 and the sealing resin 24. Furthermore, the first insulation 30 is provided between the light receiving portions 12 and the bonding pads 14.

The first insulation 30 functions as a wall and a cushion when molding the sealing resin 24. Specifically, when molding, the first insulation 30 functions as a dam wall of the sealing resin 24 to prevent the sealing resin 24 from entering the light receiving portions 12, and to reduce direct pressure of a mold applied on the semiconductor element 10. If there is no first insulation 30, the mold comes into direct contact with the semiconductor element (light receiving element) 10 and the resin leaks from the space between the semiconductor element 10 and the resin.

Also, when the mold is in direct contact with the semiconductor element 10, the pressure adversely affects the semiconductor element 10. The first insulation 30 prevents such adverse effects.

Furthermore, the first insulation 30 has a height 33 so that the bonding wires 20 are sufficiently encapsulated. Specifically, the first insulation 30 needs to have the height 33 ranging from 30 to 300 μm from the surface of the semiconductor element 10. Note that the height 33 preferably ranges from 50 to 100 μm to reduce the height of the semiconductor device 1.

The first insulation 30 is formed apart from the bonding pads 14 with a predetermined distance 32. This is because the bonding wire 20 needs to be formed by reverse wire bonding and prevent capillaries from hitting the first insulation 30 at this time. The distance 32 needs to be at least 10 μm. Also, when the distance is too large, the size of the semiconductor element 10 needs to be increased. Thus, the distance is preferably less than 50 μm.

Furthermore, the first insulation 30 is provided with the openings 39 around the light receiving portions 12. The size of the openings 39 can be increased or decreased in accordance with the type or properties of light.

Figure 2:
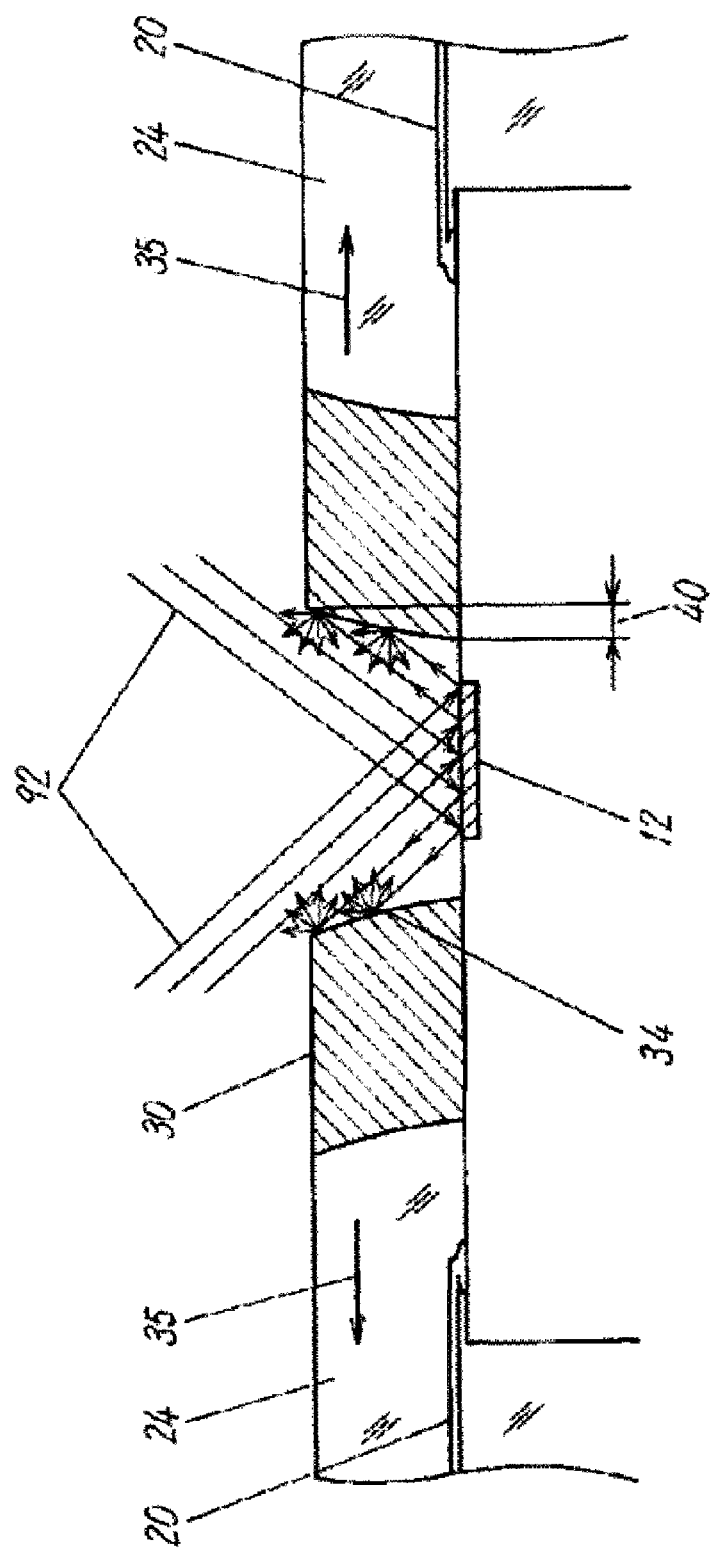
FIG. 2 is an enlarged view of a semiconductor element forming the semiconductor device according to the embodiment.

FIG. 2 is an enlarged sectional view around one of the light receiving portions 12. The first insulation 30 is present on the both sides of the light receiving portion 12. As the manufacturing order of the semiconductor device 1, the first insulation 30 is formed first, and then, the sealing resin 24 is injected. Thus, the sealing resin 24 is cooled and contracted to generate tensile stress 35. This tensile stress 35 pulls the first insulation 30 outward (to the contacted sealing resin 24). As a result, an inner wall of the first insulation 30 seen from the light receiving portion 12 is warped outward. That is, in the opening 39, the inner wall of the first insulation 30 has an opening area increasing with an increase in the distance from the first surface 7 of the semiconductor element 10 (toward the upper side) to have a tapered shape.

When the incident light 92 comes, the light reflected by the light receiving portion 12 causes diffuse reflection on the warped inner wall surface 34 of the first insulation 30 to release the most part of the light outside the light receiving portion 12. Then, the diffuse light returning to the light receiving portion 12 is reduced. This stabilizes an output of the semiconductor element 10.

The size of a warpage 40 of the first insulation 30 depends on the width and height of the first insulation 30, and the length of the sealing resin 24. However, since the linear expansion coefficient of the sealing resin 24 is on the order of $10^{-5}$, the warpage 40 ranges from several μm to about 10 μm. Note that the warpage 40 is in other words, the inner wall of the first insulation 30 inclined outward when seen from the light receiving portion 12.

Figure 3:
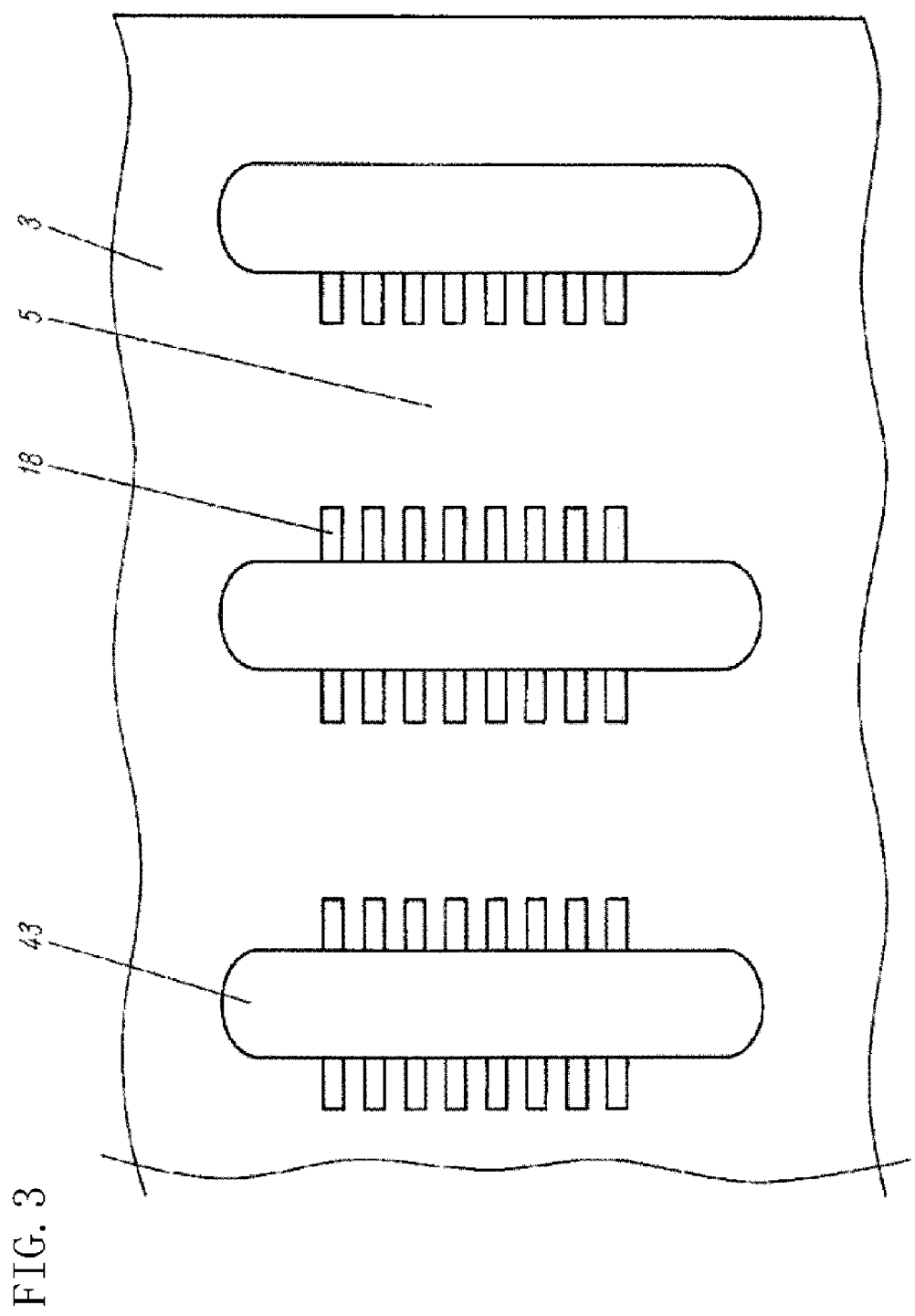
FIG. 3 illustrates a step of a manufacturing method of the semiconductor device according to the embodiment.

Then, a manufacturing method of the semiconductor device of this embodiment will be described hereinafter with reference to FIG. 3.

The substrate 3 includes a substrate surface 5 as a mounting surface on which a semiconductor element is mounted, and the substrate surface 5 is provided with through holes 43 on its both sides. A plurality of semiconductor devices are separated from the substrate 3. The extraction electrodes 18 are formed on the inner surfaces of the through holes 43 in advance. The extraction electrodes 18 are continuously formed on the substrate surface 5 and the back surface of the substrate. The extraction electrodes 18 are made of a conductive material such as copper, aluminum, gold, and silver.

Figure 4:
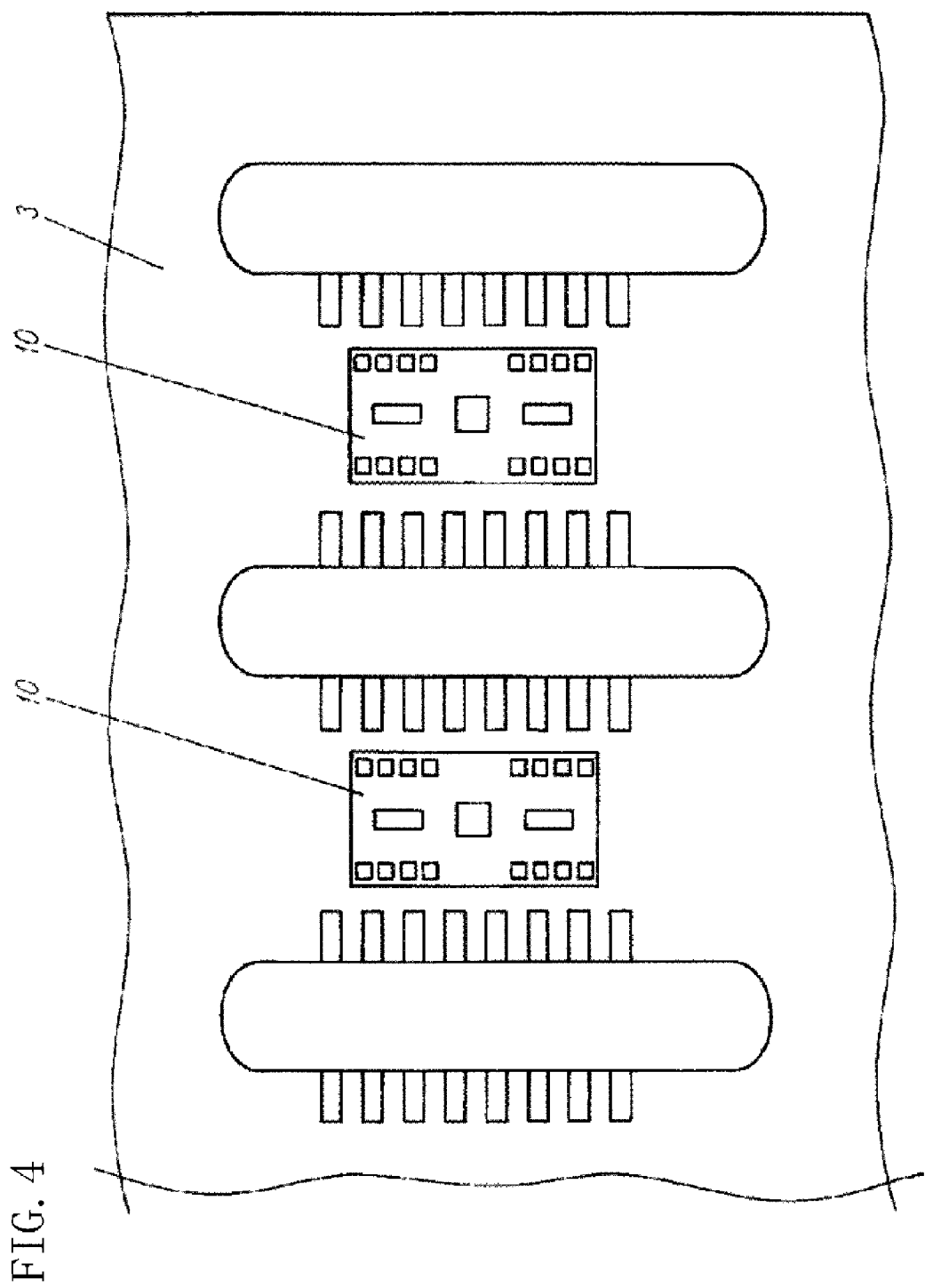
FIG. 4 illustrates a step of the manufacturing method of the semiconductor device according to the embodiment.
Figure 5:
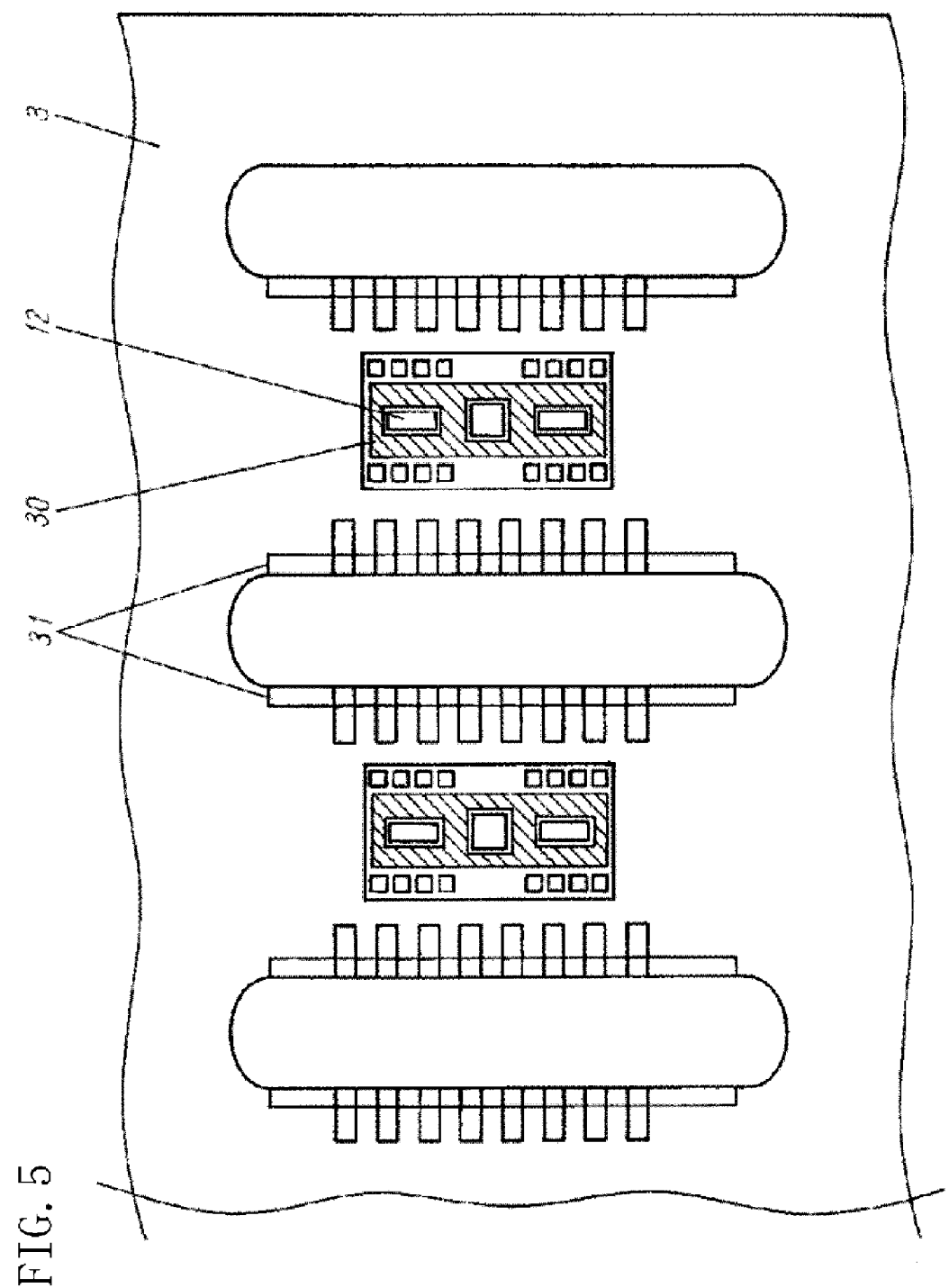
FIG. 5 illustrates a step of the manufacturing method of the semiconductor device according to the embodiment.

FIG. 4 illustrates that the semiconductor element 10 is bonded to the substrate surface 5 with an adhesive. FIG. 5 illustrates that a second insulation 31 and the first insulation 30 are formed around the light receiving portion 12. The first insulation 30 is formed by stacking resists. The second insulation 31 is formed on the extraction electrodes 18 on the substrate surface 5 near the through holes 43. The second insulation 31 is for prevention of leakage (height alignment) of the sealing resin 24 from the mold during molding of the resin 24, and functions as a cushion supporting the mold. If there is no second insulation 31, the mold is provided on (in contact with) the extraction electrodes 18 during molding, thereby creating space in the substrate 3 between the mold and the extraction electrodes 18 to cause leakage of the resin. Furthermore, the second insulation 31 functions as a cushion for preventing deformation of the mold due to pressure caused when the mold is in contact with the extraction electrodes 18.

Since the step of forming the first insulation 30 includes the step of rinsing with alkaline solution and the like, the second insulation 31 is preferably formed by printing etc. after the formation of the first insulation 30. Note that the second insulation 31 may be formed at another timing. For example, the second insulation 31 may be formed immediately after the formation of the extraction electrodes 18 shown in FIG. 3, or at the same time as the formation of the first insulation 30.

Figure 6:
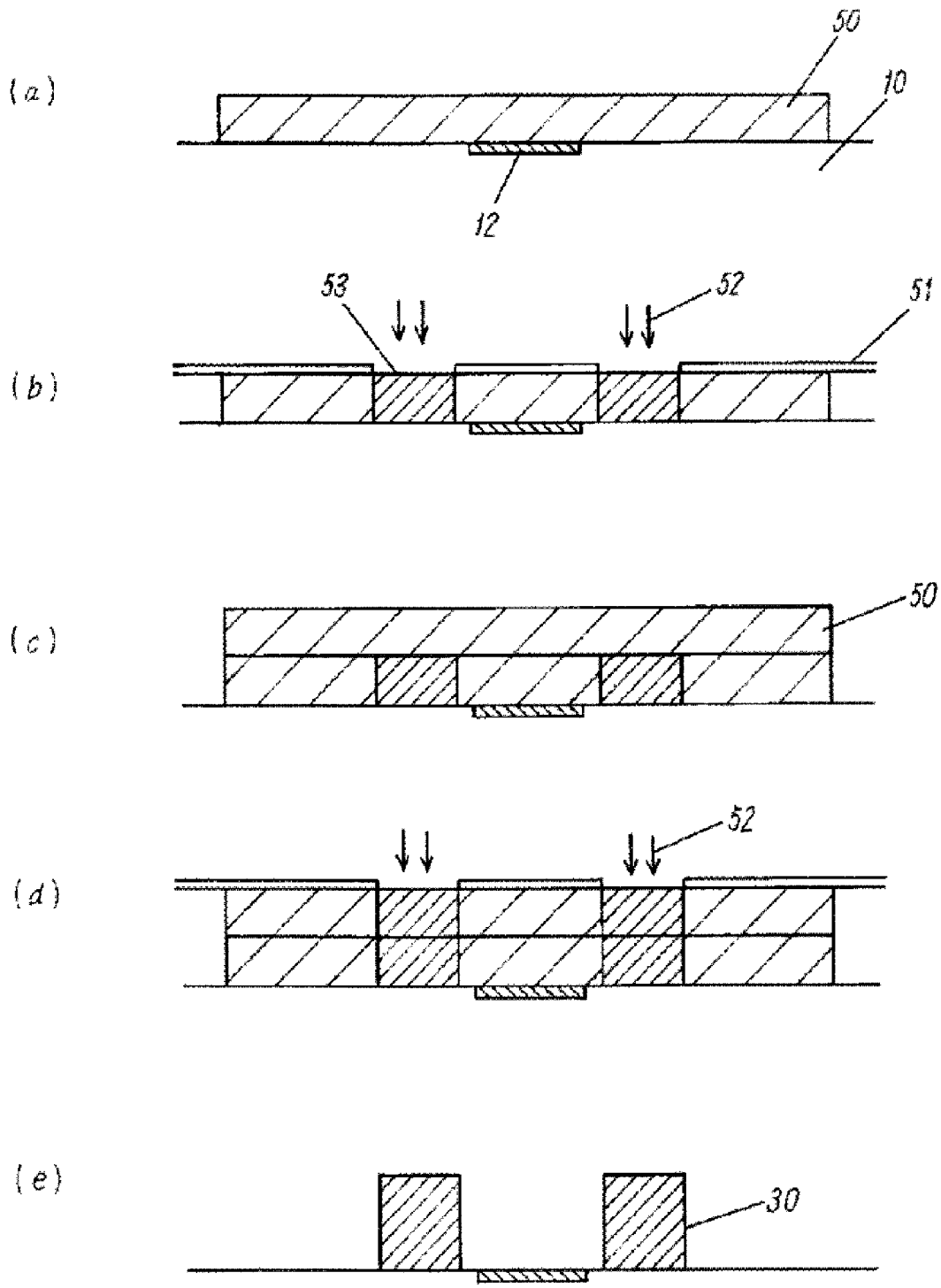
FIGS. 6(a)-(e) illustrate a process of forming a first insulation.

FIG. 6 illustrates a manufacturing method of the first insulation 30. FIG. 6(a) illustrates that a resist 50 is applied onto the semiconductor element 10. The resist 50 used here is preferably a positive resin resist. When the resist is applied a plurality of times, the positive type curing a photosensitive portion improves the accuracy of the manufacturing. While the method of applying the resist is not limited, printing is preferable, since the resist 50 is applied only on the semiconductor element 10.

Next, refer to FIG. 6 (b). The resist 50 is dried and baked at a low temperature to cure the coated film so that a part of the resist 50 is exposed to light 52 using a mask 51 for a positive. The resist at the portion 53 irradiated with the light 52 for exposure is cured.

Then, refer to FIGS. 6 (c) and 6 (d). After removing the mask 51, the resist 50 is applied again and the processes of baking and exposing are repeated. Finally, as shown in FIG. 6 (e), the unexposed part is removed with alkaline solution to form the first insulation 30.

Figure 7:
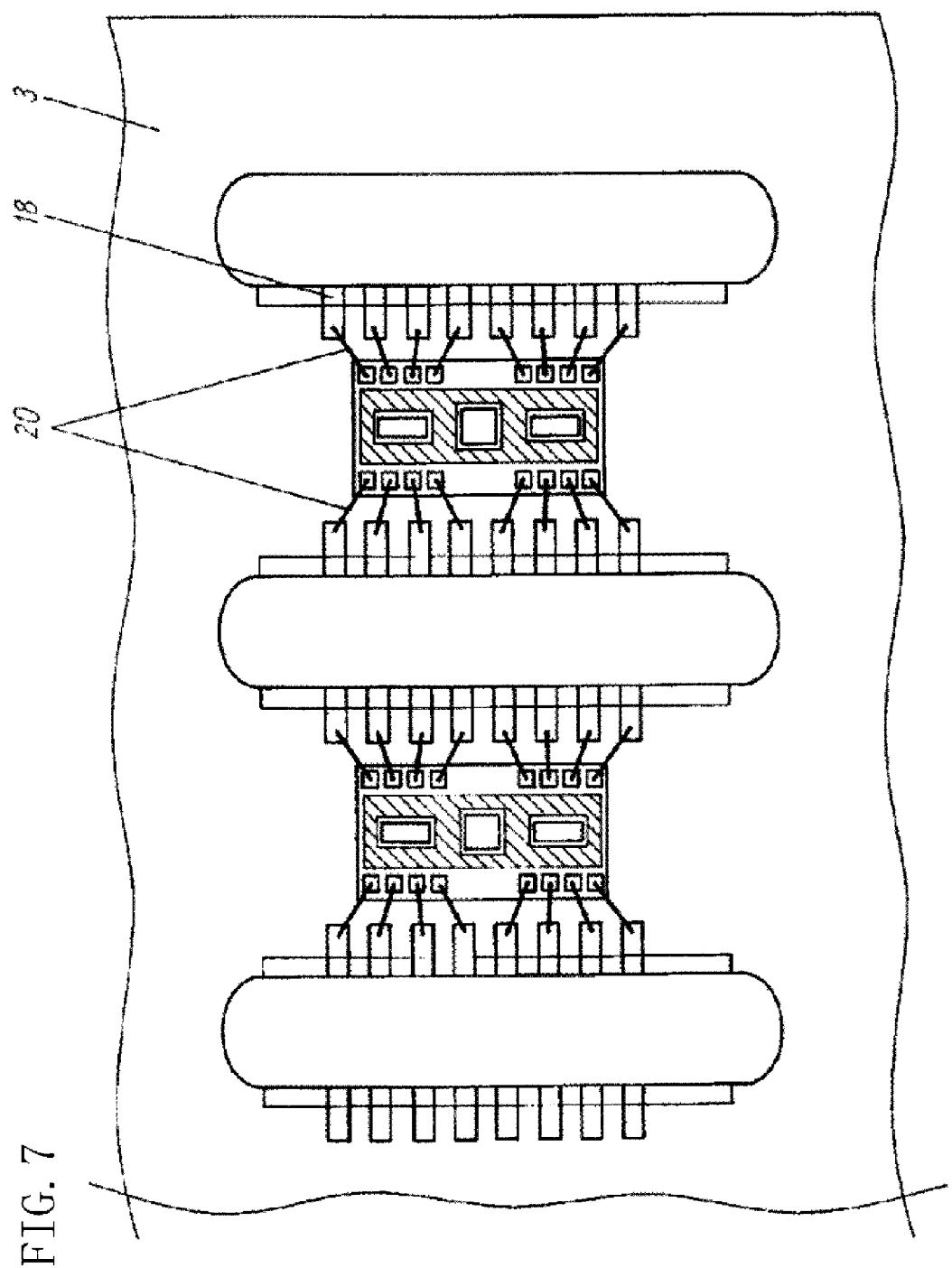
FIG. 7 illustrates a step of the manufacturing method of the semiconductor device according to the embodiment.

FIG. 7 illustrates that the semiconductor element 10 is connected to the extraction electrodes 18 on the substrate 3 by wire bonding. This allows electrical connection between the semiconductor element 10 and the extraction electrodes 18 on the substrate 3 with the bonding wires 20. As the wire bonding, ball bonding, wedge bonding, and the like may be used. Note that reverse wire bonding is used as the wire bonding.

Figure 8:
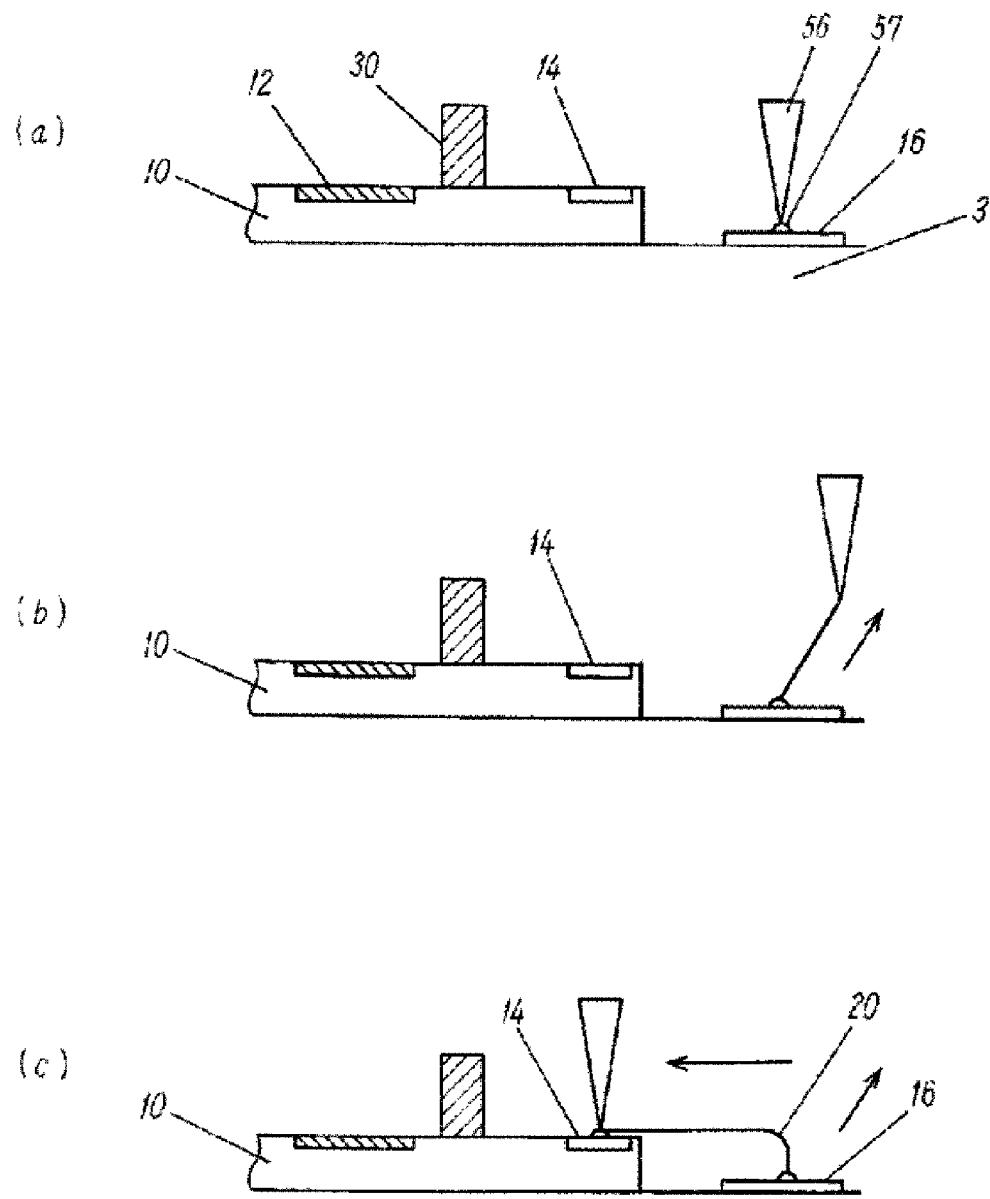
FIGS. 8(a)-(c) illustrate the step of wire bonding.

FIG. 8 is a schematic view of reverse wire bonding. In reverse wire bonding, wire bonding is performed in the opposite order to usual wire bonding in which the semiconductor element is first bonded, and then the connecting target such as the substrate are second bonded. FIG. 8 (a) illustrates a part of the semiconductor element 10 mounted on the substrate 3. The first insulation 30 is formed on the semiconductor element 10 between the light receiving portion 12 and the bonding pad 14. A substrate side bonding pad 16 is formed on the substrate 3. The bonding pad 16 may be an extraction electrode 18 itself.

FIG. 8 (a) illustrates that the end of a wire is formed in a ball shape on the apex of a capillary 56. First, the capillary 56 is transferred to the bonding pad 16 so that the ball of the apex comes into contact with the bonding pad 16 on the substrate 3. Then, heat, the load, and ultrasound are transferred to the ball, thereby forming a first bond 57.

FIG. 8 (b) illustrates that the capillary 56 is obliquely pulled to a predetermined height in the opposite direction to the position of the second bonding. In this case, the position of the second bonding is at the bonding pad 14 on the semiconductor element 10.

FIG. 8 (c) illustrates that the capillary 56 moves to the bonding pad 14 in the semiconductor element 10 subjected to the second bonding. As such, by pulling the capillary 56 in the opposite direction to the direction of the second bonding, the length of the bonding wire 20 needed for wire bonding can be ensured, and the end side of the semiconductor element 10 is prevented from coming into contact with the bonding wire 20. This reduces defects such as disconnection.

Figure 9:
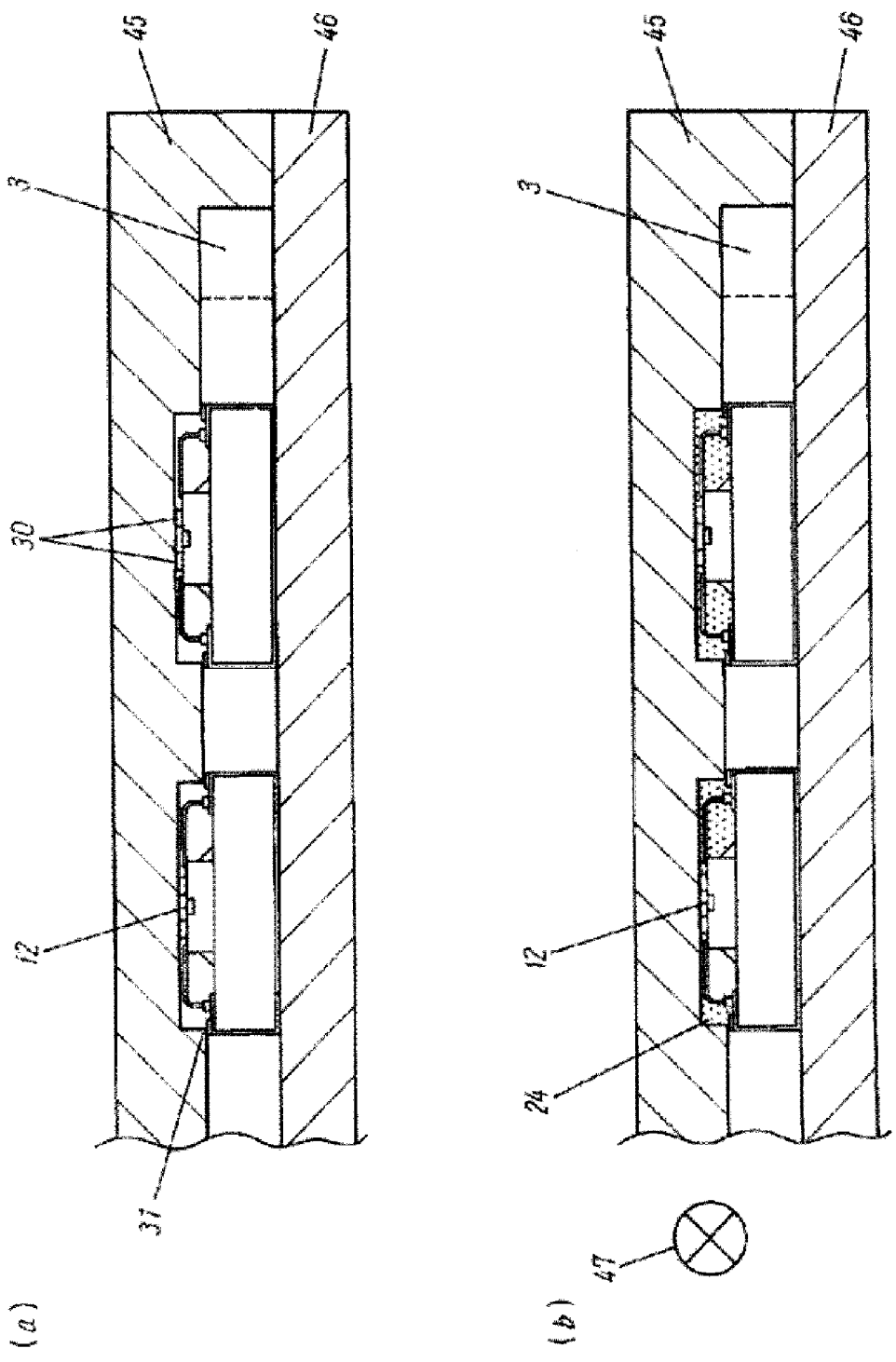
FIGS. 9(a)-(b) illustrate the step of resin molding in the manufacturing method of the semiconductor device according to the embodiment.
Figure 11:
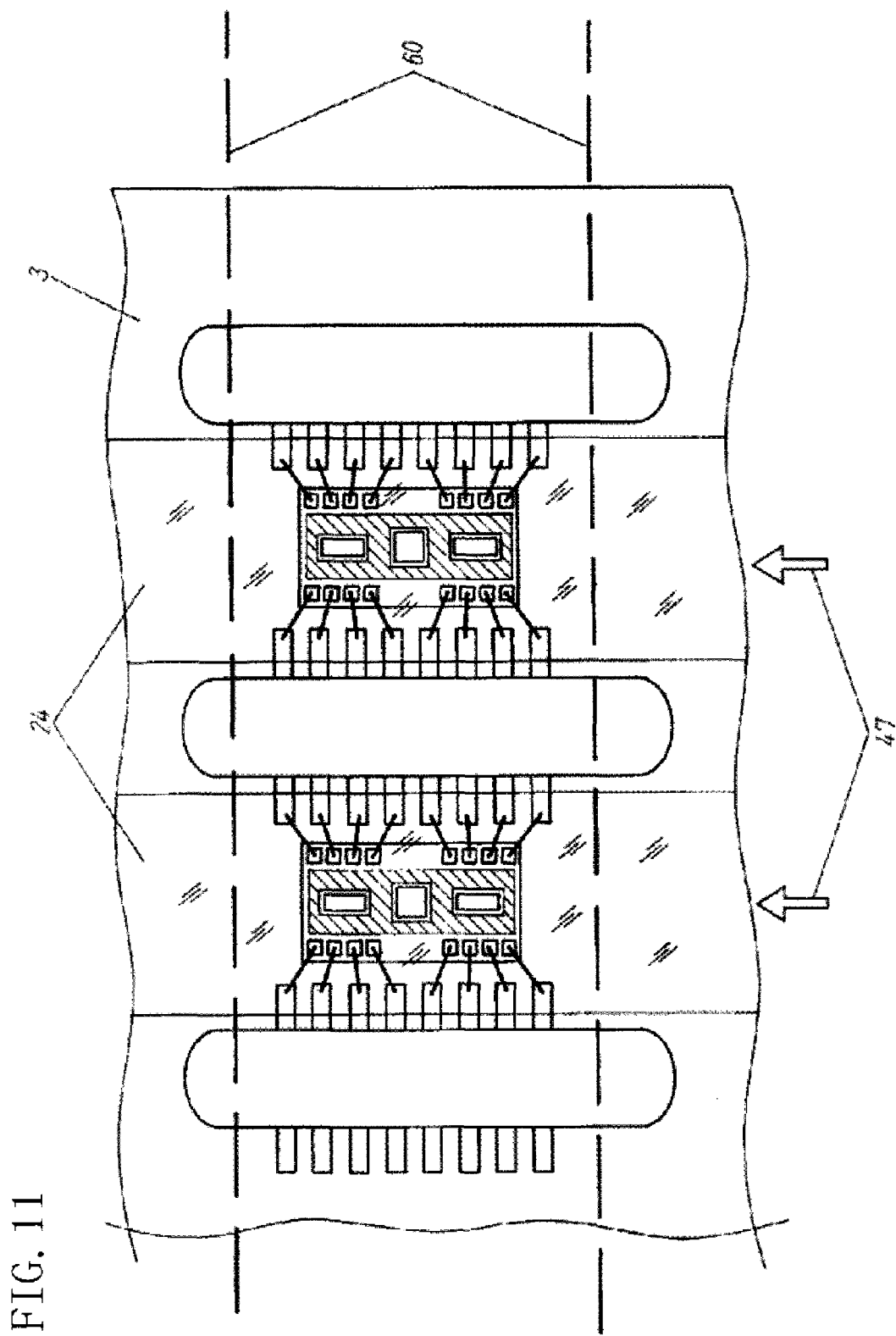
FIG. 11 illustrates the step of separating chips in the manufacturing method of the semiconductor device according to the embodiment.

FIG. 9 illustrates that after wire bonding, the sealing resin 24 is filled from a flow direction 47 of the resin shown in FIG. 11 (FIG. 9 (b)), while pressing molds 45 and 46 onto the substrate 3 and the first insulation 30 to apply pressure (FIG. 9 (a)). The sealing resin 24 is filled in a direction into the page of FIG. 9. The molds are pressed onto the substrate 3 and the first insulation 30 to prevent the sealing resin from leaking from the space between the first insulation 30 and the mold 45. Therefore, the resin is not filled from the first insulation 30 to the light receiving portion 12.

Figure 10:
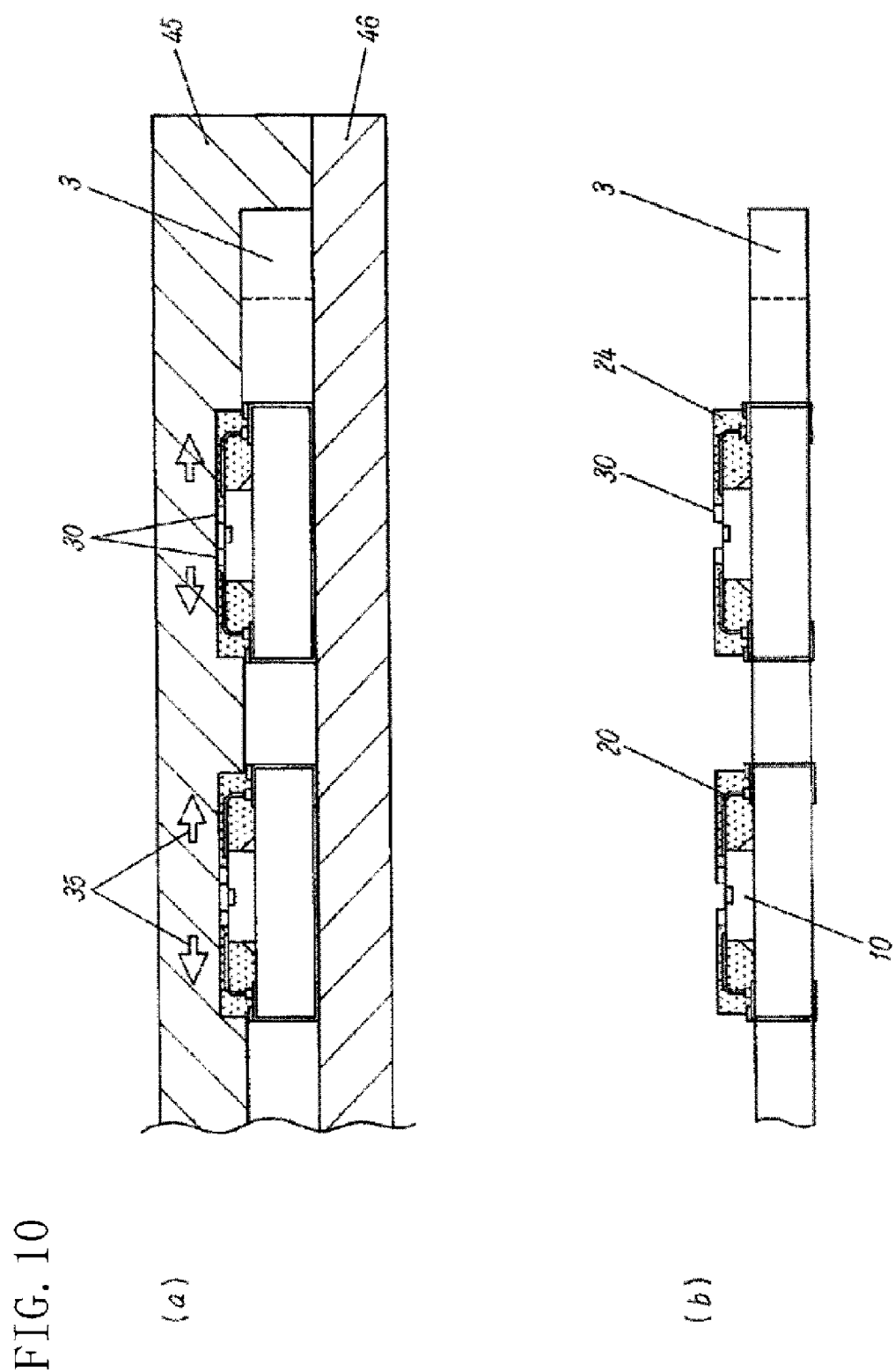
FIGS. 10(a)-(b) illustrate the step of resin molding in the manufacturing method of the semiconductor device according to the embodiment.

FIG. 10 illustrates removing the mold after the sealing resin 24 is cooled and cured. The introduced sealing resin 24 comes into contact with the cool outer periphery of the first insulation 30 and is bonded to the periphery. When the sealing resin 24 itself is cooled and cured, the sealing resin 24 is contracted to generate stress 35 in the direction separating the first insulation 30 from the light receiving portion 12 (FIG. 10 (a)). The first insulation 30 is inclined outward to be spaced apart from the light receiving portion 12 due to the stress (FIG. 10 (b)). FIG. 11 illustrates that the substrate 3 is cut along cutting plane lines 60 to obtain semiconductor devices. Note that FIG. 11 illustrates a part filled with the sealing resin 24 and a filling direction 47.

Next, variations of the semiconductor light receiving device will be described as other embodiments. Note that explanation of parts having the same structures as those in the first embodiment is omitted.

Second Embodiment

Figure 12:
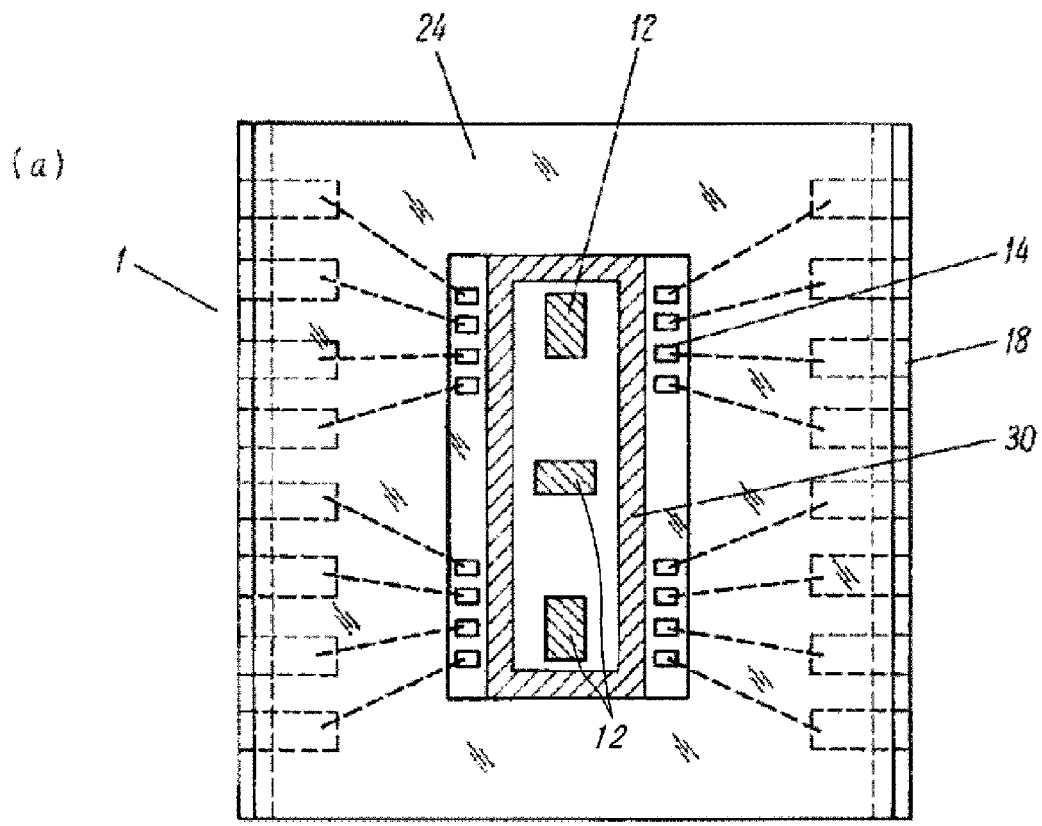
FIGS. 12(a)-(b) illustrate a variation of the semiconductor device according to the embodiment.
Figure 12:
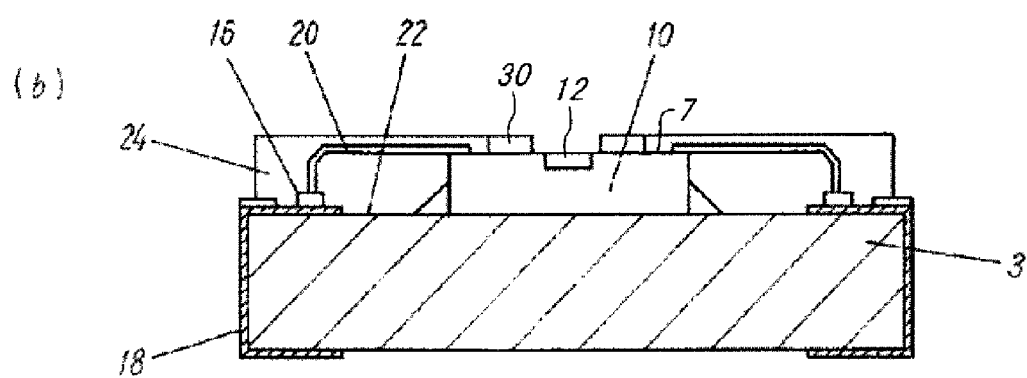

FIG. 12 illustrates a semiconductor device according to a second embodiment including a first insulation 30 having a predetermined width and surrounding light receiving portions 12 as a whole. Specifically, while each of the three light receiving portions 12 is surrounded by the first insulation 30 in the first embodiment, the first insulation 30 surrounds the three light receiving portions 12 as a whole and the first insulation 30 is not provided between two of the light receiving portions in the second embodiment. This makes mask formation relatively simple when forming the insulation or the mold of the sealing resin.

Third Embodiment

Figure 13:
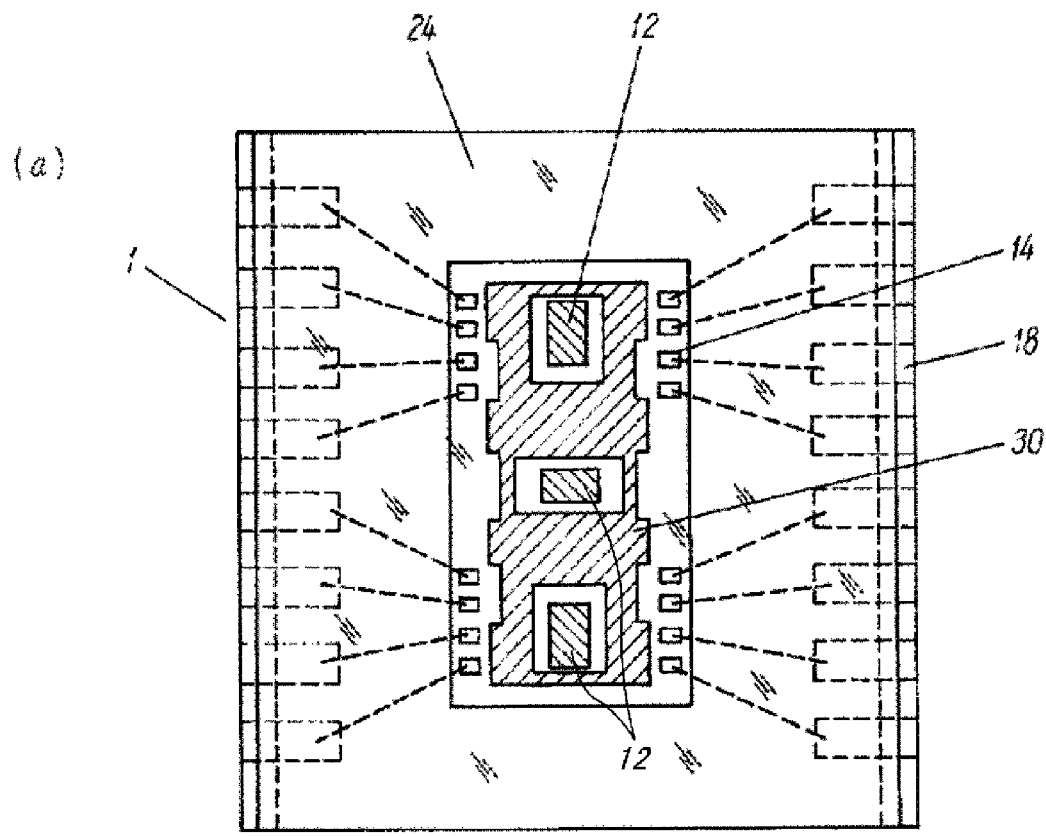
FIGS. 13(a)-(b) illustrate a variation of the semiconductor device according to the embodiment.
Figure 13:
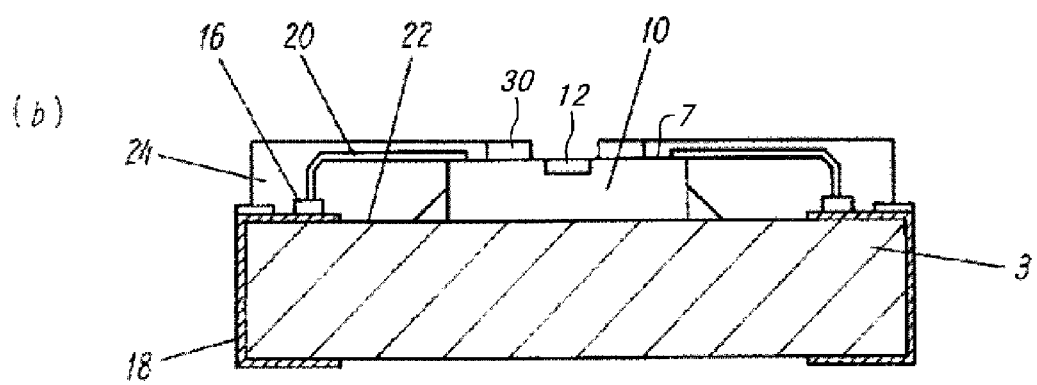

FIG. 13 illustrates a semiconductor device according to a third embodiment having projections and recesses at the connection boundary (the outer wall of the first insulation 30) between the first insulation 30 and the sealing resin 24. By forming the projections and recesses, bonding strength between the first insulation 30 and the sealing resin 24 can be improved.

Fourth Embodiment

Figure 14:
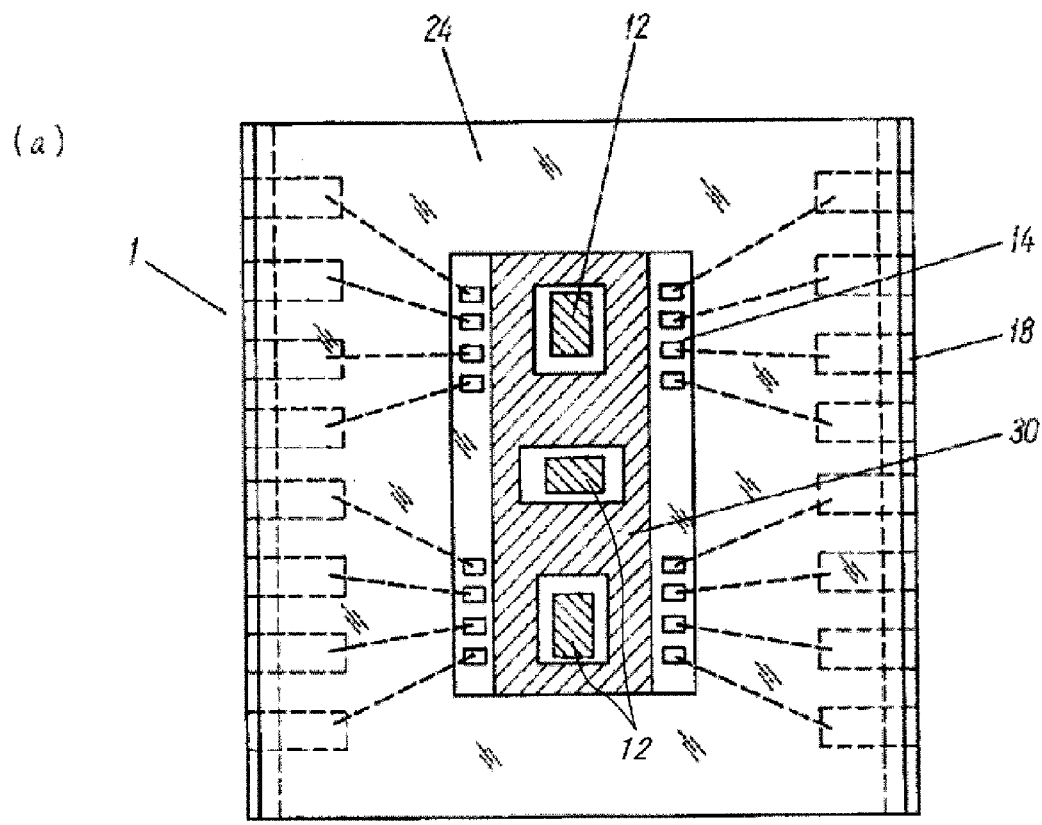
FIGS. 14(a)-(b) illustrate a variation of the semiconductor device according to the embodiment.
Figure 14:
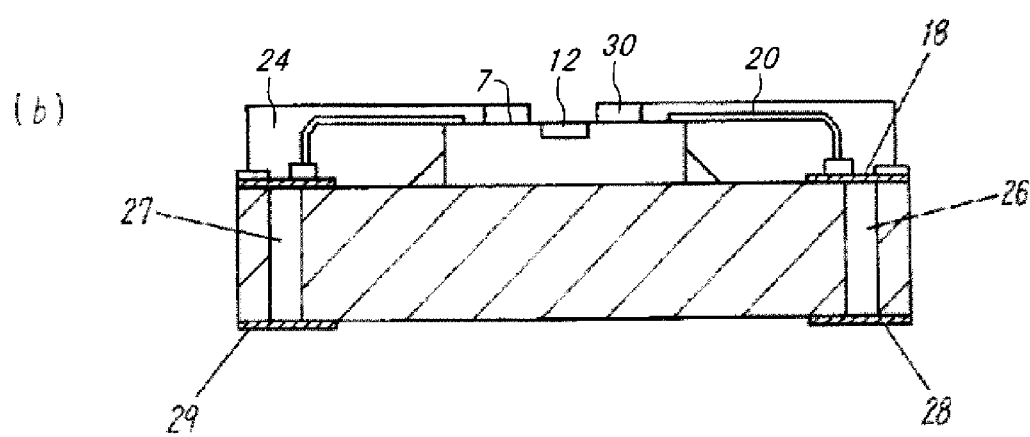

FIG. 14 illustrates a semiconductor device according to a fourth embodiment in which through holes are formed in the substrate 3 so that a part of each of the extraction electrodes 18 is made of a conductive material filled in the through holes. The through electrodes 26 and 27 are formed by filling a conductive material such as copper, aluminum, and gold inside the through holes provided in the substrate 3. Back surface electrodes 28 and 29 are electrically connected to the through electrodes 26 and 27, and are made of a conductive material such as copper, silver, and gold.

Fifth Embodiment

Figure 15:
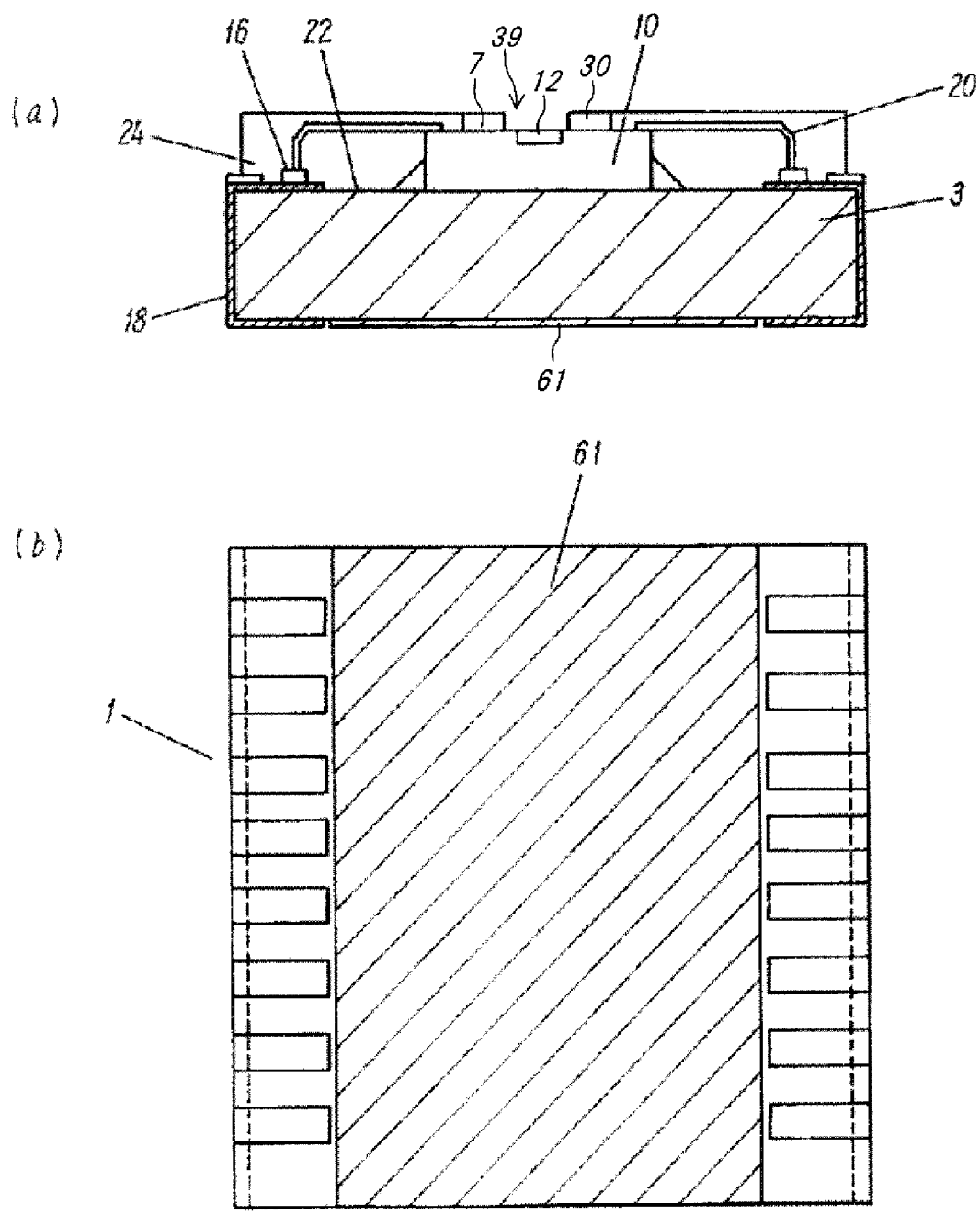
FIGS. 15(a)-(b) illustrate a variation of the semiconductor device according to the embodiment.

FIG. 15 illustrates a semiconductor device according to a fifth embodiment including a third insulation 61 arranged on a back surface of a substrate 3. The third insulation 61 warps the substrate 3 during molding of the sealing resin 24. Thus, the first insulation 30 has a tapered shape in which the formed opening 39 over the light receiving portion 12 is open at the upper portion. More specifically, the third insulation 61 supports the stress 35 pulling the first insulation 30 outward in FIG. 10. Note that the third insulation 61 may be made of the same resin as the first insulation 30.

Note that, the third insulation 61 may not be applied on the entire back surface, but may be applied on a half or one-third of the back surface, or in an appropriate form to provide a portion not applied with the insulation. This is because, the warpage of the substrate 3 can be controlled by controlling the application of the insulation 61.

Sixth Embodiment

Figure 16:
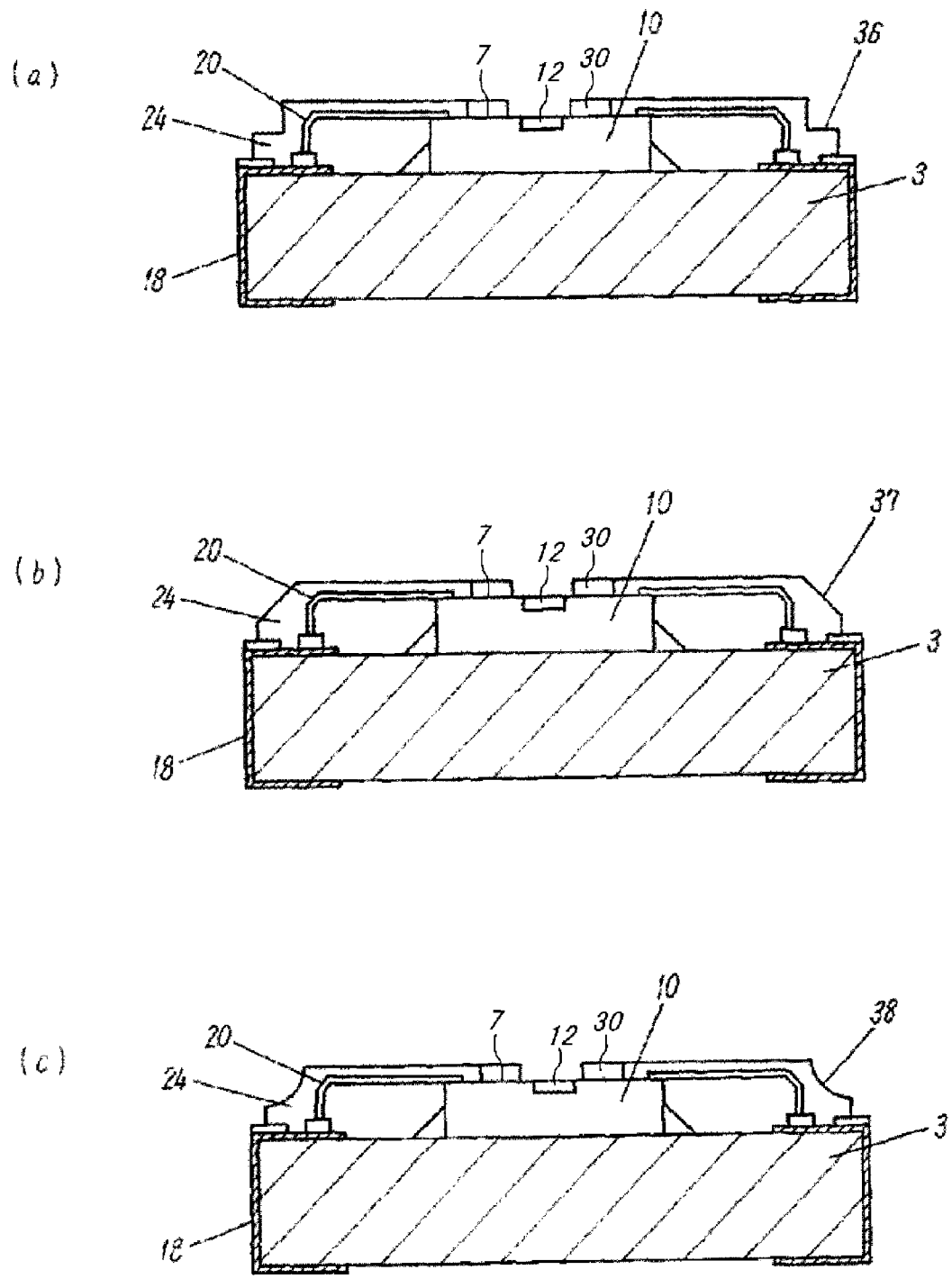
FIGS. 16(a)-(c) illustrate a variation of the semiconductor device according to the embodiment.

FIG. 16 illustrates a variation of a semiconductor device according to a sixth embodiment in which corners of the outer edges of the sealing resin 24 are cut off. With an increase in the integration of a printing board, the corners of the outer edge of the sealing resin 24 may come into contact with other components. With a decrease in unnecessary portions, interference with other components can be reduced.

FIG. 16 (a) illustrates steps 36 formed by rounding the corners.

FIG. 16 (b) illustrates tapers 37 formed by rounding the corners.

FIG. 16 (c) illustrates R shapes 38 formed by rounding the corners.

The cutoff corners may be provided when forming the mold 45 for the sealing resin or may be molded by cutting and grinding after forming the sealing resin 24.

INDUSTRIAL APPLICABILITY

The present invention is useful for semiconductor devices and the like in which bare chips with exposed light receiving portions.

What is claimed is:

1. A semiconductor device comprising:
    a semiconductor element; and
    a substrate on which the semiconductor element is mounted, wherein
    the semiconductor element includes a light receiving portion and a bonding pad on a first surface, and a back surface of the first surface is mounted on the substrate,
    an extraction electrode is formed on a mounting surface of the substrate on which the semiconductor element is mounted,
    the bonding pad and the extraction electrode are connected together by a metal thin wire,
    a first insulation, which exists between the light receiving portion and the bonding pad and surrounds the light receiving portion, is provided on the first surface of the semiconductor element,
    the bonding pad and the metal thin wire are encapsulated with a sealing resin,
    an outer edge of the first insulation is in contact with the sealing resin on the first surface of the semiconductor element,
    an inner wall of the first insulation facing the light receiving portion and surrounding the light receiving portion has a tapered shape in which an opening area gradually expands with an increase in a distance from the first surface of the semiconductor element, the extraction electrode extends to an outer edge of the mounting surface; and
    a second insulation is formed surrounding the mounting surface and on the extraction electrode.

2. The semiconductor device of claim 1, wherein the metal thin wire is formed by reverse wiring in which a second bond is connected to the bonding pad.

3. The semiconductor device of claim 1 or 2, wherein the first insulation is provided on the semiconductor element with a predetermined width.

4. The semiconductor device of claim 1 or 2, wherein an outer wall of the first insulation has projections and recesses.

5. The semiconductor device of claim 1 or 2, wherein a third insulation is provided on a back surface of the substrate which is opposite to the mounting surface.

6. The semiconductor device of claim 1 or 2, wherein the substrate is provided with a through-hole.

7. The semiconductor device of claim 1 or 2, wherein a corner of an outer edge of the sealing resin is cut off.

* * * * *